(12) United States Patent
Song

(10) Patent No.: US 6,653,959 B1
(45) Date of Patent: Nov. 25, 2003

(54) HIGH DYNAMIC RANGE ANALOG-TO-DIGITAL CONVERTER HAVING PARALLEL EQUALIZERS

(75) Inventor: William S. Song, Lexington, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 10/153,476

(22) Filed: May 22, 2002

(51) Int. Cl.[7] .......................... H03M 1/12; H03M 1/20
(52) U.S. Cl. .......................... 341/131; 341/155
(58) Field of Search .................. 341/155, 131, 341/143; 333/18; 330/2; 702/190; 345/597; 375/233, 229, 232

(56) References Cited

U.S. PATENT DOCUMENTS

| | | | | |
|---|---|---|---|---|
| 4,914,439 A | * | 4/1990 | Nakahashi et al. | 341/131 |
| 5,073,777 A | * | 12/1991 | Fukuhara et al. | 341/131 |
| 5,825,318 A | * | 10/1998 | Patapoutian et al. | 341/131 |
| 5,844,941 A | * | 12/1998 | Mack et al. | 375/232 |
| 5,952,945 A | * | 9/1999 | Latham et al. | 341/131 |
| 5,963,157 A | * | 10/1999 | Smith | 341/131 |
| 6,404,364 B1 | * | 6/2002 | Fetterman et al. | 341/131 |

OTHER PUBLICATIONS

"Analysis of Mismatch Effects Among A/D Converters in a Time–Interleaved Waveform Digitizer," Petraglia et al. *IEEE Transactions on Instrumentation and Measurement.* Oct. 1991. vol. 40, No. 5.

"High–Performance Advanced Filter Bank Analog–to–Digital Converter for Universal RF Receiver," Scott R. Velaquez. *V Company.* 1998. p. 229–232.

"Design of Hybrid Filter Banks for Analog/Digital Conversion," Velaquez et al. *IEEE Transactions on Signal Processing.* Apr. 1998. vol. 46, No. 4.

* cited by examiner

*Primary Examiner*—Patrick Wamsley
(74) *Attorney, Agent, or Firm*—Samuels, Gauthier & Stevens, LLP

(57) ABSTRACT

An analog-to-digital converting includes a fanned out module for receiving an input signal and producing a plurality of new signals. A plurality of analog to digital converter modules receive the new signals from the fanned out module. Each of the new signals is assigned at least one of the analog to digital converters, such that the digital converter modules produce a plurality of digitized signals from each of their associated new signals. A combiner module receives the plurality of digitized signals, and combines the plurality of digitized signals to form a single digitized signal.

10 Claims, 1 Drawing Sheet

HIGH DYNAMIC RANGE ANALOG-TO-DIGITAL CONVERTER HAVING PARALLEL EQUALIZERS

This invention was made with government support under Contract No. F19628-95-C-0002 awarded by the United States Air Force. The government has certain rights in the invention.

BACKGROUND OF THE INVENTION

The invention relates to the field of analog-to-digital converters, and in particular to an analog-to-digital converter that uses multiple analog-to-digital converters (ADC) to improve dynamic range performance.

Digital signal processing has become a very important technology in many application areas including communications, radar, sonar, and many consumer electronic applications. Many of these applications use high dynamic range used in ADCs to convert analog sensor signals into digital data. However, the dynamic range of standard ADCs has been increasing only marginally with time. Typical improvement over the last few years has been approximately 1 dB per year, or equivalent 1 effective bit every 6 years for a given Nyquist sampling rate. Dynamic range is typically defined as signal to noise and distortion ratio (SINDR). It is the ratio between signal level versus the sum of noise, harmonic spurs, and intermodulations at the output of an ADC.

Further, the dynamic range also depends on sampling rate. For any given ADC device, it is generally know that it is possible to increase the dynamic range approximately 6 dB, if the Nyquist rate is reduced by half.

One should be able to increase the sampling rate without reducing the dynamic range by using multiple ADCs. For example, one can use multiple ADCs in round robin fashion to increase the sampling rate. If N ADCs were used, the sampling rate would be increased N times. However, there are many practical difficulties in implementing this scheme. One difficulty is that a high-dynamic range high-speed sample and hold (S/H) circuitry is needed to make this scheme work, and such sample and hold circuitry is difficult to build. The S/H circuitry needs to work N times faster with this scheme. In addition, variations in gain, offset, and sampling clock delays among multiple ADCs typically reduce the dynamic range gain of such systems.

SUMMARY OF THE INVENTION

Accordingly, the invention provides an analog-to-digital converter (ADC) with significantly improved dynamic range performance. The invention uses multiple ADCs with independent dither signals and digital processing to improve the dynamic range performance. This scheme provides superior performance because of relative insensitivity to device and circuitry mismatches and imperfections.

According to one embodiment of the invention, there is provided an analog-to-digital converter. The analog-to-digital converter includes a fanned out module for receiving an input signal and producing a plurality of new signals. A plurality of analog to digital converter modules receive the new signals from the fanned module. Each of the new signals is assigned at least one of the analog to digital converters, such that the digital converter modules produce a plurality of digitized signals from each of their associated new signals. A combiner module receives the plurality of digitized signals. The plurality of digitized signals are combined to form a single digitized signal.

According to another embodiment of the invention, there is provided a method of converting an analog signal into a digital signal. The method includes receiving as input the analog signal, and producing a plurality of independent new signals from the analog signals. Each of the independent new signals is assigned to one of a plurality of analog to digital modules, and performing on each of the independent new signals analog to digital operations, such that a plurality of digitized signals are produced. Equalization operations are performed on each of the digitized signals, so that imperfections are removed from the digitized signals. The digitized signals are combined to form the digital signal.

According to another aspect of the invention, a method for analog-to-digital converting is provided. The method includes receiving an input signal and producing a plurality of new signals. Each of the new signals is assigned at least one of a plurality of analog to digital modules, such that the analog to digital modules produce a plurality of digitized signals from each of their associated new signals. The method further includes receiving the plurality of digitized signals. The plurality of digitized signals are combined to form a single digitized signal.

DETAILED DESCRIPTION OF THE INVENTION

Figure 1:
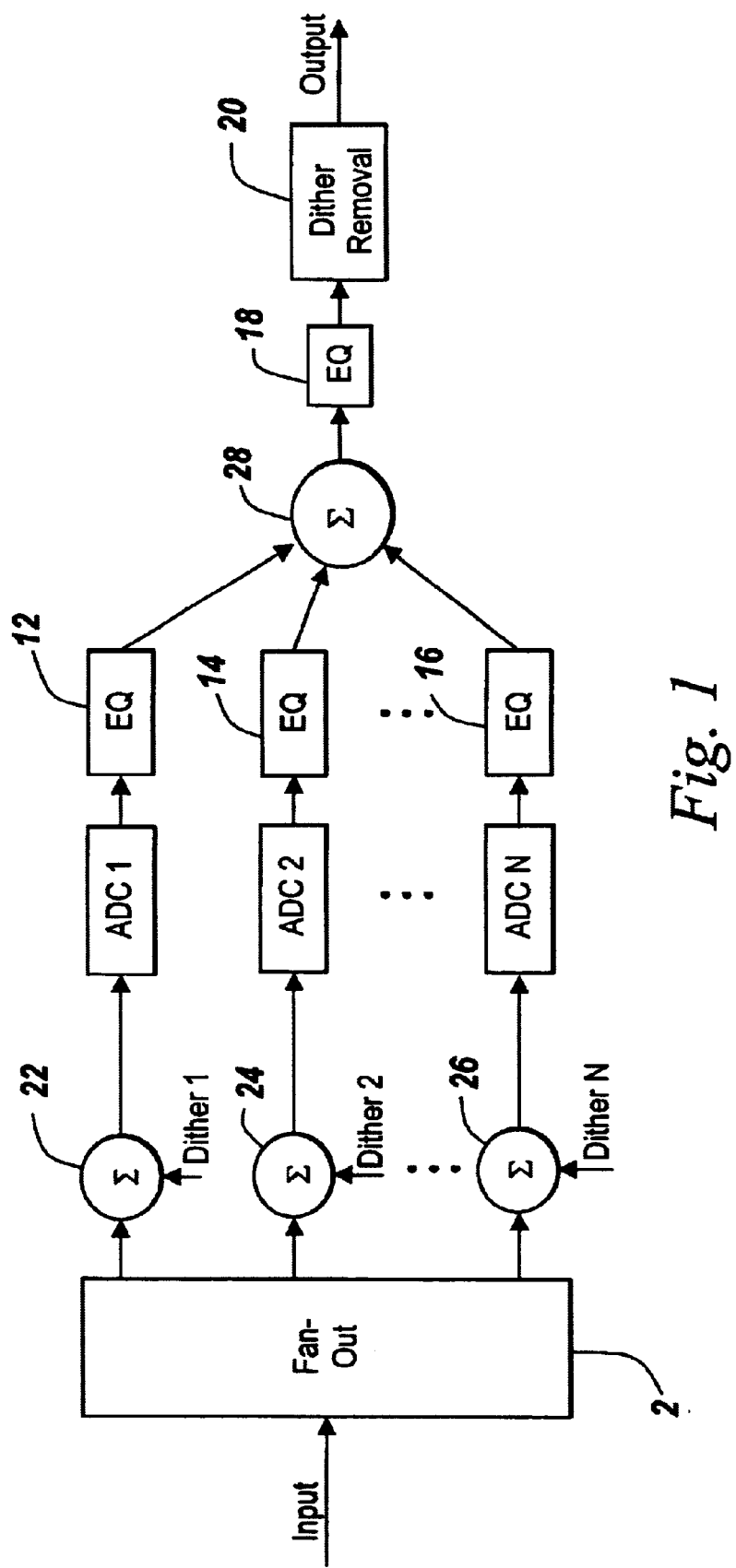
FIG. 1 is a schematic diagram of the dynamic range ADC system of the invention.

The invention provides a scheme that uses multiple ADCs to gain dynamic range is presented that does require high speed, high dynamic range S/H circuitry beyond what is normally required for a single ADC. The invention is more tolerant to variations in gain, offset, and sampling clock delays among multiple ADCs. This also allows more tolerance to variations in frequency dependent ADC characteristics.

FIG. 1 is a schematic of the dynamic range ADC system of the invention. A fan-out module 2 receives an analog input signal. The fan-out module 2 fans out the input signal to multiple ADCs 1–N. The signal gain, phase, and delay introduced by the fan-out module 2 can be identical or can contain variations. These variations and other imperfections may be removed later by digital equalization, which will discussed more below. These variations may also improve the performance in some cases by decorrelating unwanted signals across multiple ADCs. The fan-out module 2 can include a series of signal dividers, which divides the input signal into N separate signals. If N is large, additional signal amplification would be required. Such amplification can be arranged at the input, output, or any other points within the fan-out module 2.

At the output of the fan-out module 2, independent dither signals are added to each of the output signals, and they are used to de-correlate quantization noise between different ADCs. The dither signals 1–N are assigned to different channels, and have no correlation to each other. They should be the kind of signal that can be subtracted out later in the signal processing chain. One possible example of a dither signal is an out-of-band noise signal, which can be easily filtered out digitally later. Summation modules 22, 24, and 26 are used for adding the dither signals 1–N to the output signals of the fan-out module 2, and can be circuit elements, such as signal combiners.

Each of the resulting signals is then fed through multiple ADCs 1–N. The ADCs 1–N may be clocked synchronously or may be clocked with different phase delays. The ADC clocks should be phased locked to each other, and do not have to be synchronized.

Digital equalizers 12, 14, and 16, which perform linear equalization as well as non-linear equalization in the digital domain, then equalize the outputs from ADC 1–N. The linear equalization removes linear mismatches between channels, such as gain, offset, sampling delay, and frequency dependent gain/phase variations. The non-linear equalization suppresses harmonic spurs and inter-modulation signals. The digital equalizers 12, 14, and 16 can be used to subtract out the dither signals, and equalizes the clock mismatch associated with the ADC clocks not being synchronized. In addition, the input to the fan-out module 2 does not have to be aligned exactly, because the digital equalizers 12, 14, and 16 perform the necessary alignment.

The outputs of the equalizers 12, 14, and 16 are then summed together by a summation module 28. It is also possible to compute the weighted sum. The summation module 28 can be an adder. The sum can be used instead of a weighted average if the digital equalizer 12, 14, and 16 are used after each ADC 1–N.

The resultant signal is fed to another equalizer stage 18 that performs linear and non-linear equalization tasks. This stage may not be necessary if the digital equalizers 12, 14, and 16 are implemented. The digital equalizer 18 may also be used to subtract out the dither signals.

The resulting signal is fed through a dither signal removal stage 20, which digitally removes the dither signal. If either of the digital equalizer 18 or digital equalizers 12, 14, and 16 removes the dither signal previously, this may be an optional stage.

In another embodiment, the digital equalizers 12, 14, and 16 perform linear equalization and the digital equalizer 18 perform non-linear equalization. This arrangement allows for easier equalization of ADC non-linearities.

In order to improve the ADC dynamic range, both the signal-to-noise ratio and linearity (SNR) have to be improved. The invention improves both the SNR and linearity. The SNR is improved by combining the equalized outputs of the multiple ADCs 1–N. Because the signals add coherently and because the noise power adds incoherently, approximately 3 dB of SNR is gained for every doubling of the number of ADCs. For example, 16 ADCs would provide approximately 12 dB of SNR gain. The 12 dB improvement would be an astonishing improvement over the state of the prior art. Being able to combine the ADC outputs for SNR gain is only possible because independent dither signals are added to the ADC inputs. The independent dither signals prevent noise signals from adding incoherently. The SNR gain is defined as $$SNR\_GAIN = \sqrt{N} \qquad \text{Eq. 1}$$

where N is number of ADCs used.

Combining the ADC output signals would also likely increase linearity as well. If harmonic spurs and intermodulations from different ADCs are not correlated, there would be approximately 3 dB reduction in the levels of harmonic spurs and intermodulations for every doubling of the number of ADCs. If the linearity is not sufficiently removed by combining ADC outputs, non-linear equalization processes can provide additional linearity improvement.

The invention may be very useful in many applications that use ADCs including communication, radar, sonar, and many other communications applications, such as cellular base stations, satellite communications, and optical communication.

Although the present invention has been shown and described with respect to several preferred embodiments thereof, various changes, omissions and additions to the form and detail thereof, may be made therein, without departing from the spirit and scope of the invention.

What is claimed is:

1. An analog-to-digital converter comprising:
   a fanned out module for receiving an input signal and producing a plurality of new signals;
   a plurality of analog to digital converter modules for receiving said new signals from said fanned module, wherein each of said new signals is assigned at least one of said analog to digital converter modules, such that said modules produce a plurality of digitized signals from each of their associated new signals; and
   a combiner module for receiving said plurality of digitized signals, wherein said plurality of digitized signals are combined to form a single digitized signal.

2. The analog to digital converter-of claim 1 further comprises -a second equalizer that receives the single digitized signal and performs linear or non-linear equalization.

3. The analog to digital converter of claim 2 wherein said new signals each include a dither signal.

4. The analog to digital converter of claim 3 further comprising a dither removal module that removes dither signals associated with the output of said second equalizer.

5. The analog to digital converter of claim 1 further comprises a first set of equalizers that are associated with said analog to digital converter modules, wherein said first set of equalizers receive as input the outputs of their respective analog to digital converter modules for performing linear or non-linear equalization.

6. A method of converting an analog signal into a digital signal, comprising:
   receiving an analog signal as an input;
   producing a plurality of independent new signals from said analog signal;
   assigning each of said independent new signals to one of a plurality of analog to digital modules;
   performing on each of said independent new signals analog to digital operations, such that a plurality of digitized signals are produced;
   performing equalization operations on each of said digitized signals, so that imperfections are removed from said digitized signals; and
   combining said digitized signals to form said digital signal.

7. The method of claim 6, wherein performing equalization includes performing linear or non-linear equalization operations on said digitized signal.

8. The method of claim 7, wherein said new signals each include a dither signal.

9. The method of claim 8 further comprising removing said dither signals.

10. A method for analog-to-digital converting, comprising:
    receiving an input signal and producing a plurality of new signals;
    assigning to each of said new signals at least one of a plurality of analog to digital modules, such that said analog to digital modules produce a plurality of digitized signals from each of their associated new signals; and
    receiving said plurality of digitized signals, wherein said plurality digitized signals are combined to form a single digitized signal.

* * * * *